United States Patent [19]
Tange et al.

[11] Patent Number: 5,961,742
[45] Date of Patent: Oct. 5, 1999

[54] CONVERGING SOLAR CELL ELEMENT

[75] Inventors: Kyoichi Tange, Mishima; Tomonori Nagashima, Susono, both of Japan

[73] Assignee: Toyota Jidosha Kabushiki Kaisha, Japan

[21] Appl. No.: 08/946,788

[22] Filed: Oct. 8, 1997

[30] Foreign Application Priority Data

Oct. 9, 1996 [JP] Japan ..................... 8-268481

[51] Int. Cl.$^6$ ..................... H01L 31/06
[52] U.S. Cl. ............ 136/256; 136/259; 126/684; 126/698; 257/465; 257/466; 257/432; 257/436
[58] Field of Search ................. 136/256, 259; 126/680, 684, 698; 438/71; 257/466, 465, 436, 432

[56] References Cited

U.S. PATENT DOCUMENTS 4,133,698  1/1979  Chiang et al. ................ 136/255
5,641,362  6/1997  Meier ........................ 136/256

OTHER PUBLICATIONS

Hu et al, Solar Cells. From Basic to Advanced Systems. McGraw–Hill, pp. 96–97. (month unknown), 1983.

*Primary Examiner*—Alan Diamond
*Attorney, Agent, or Firm*—Finnegan, Henderson, Farabow, Garrett, & Dunner, LLP

[57] ABSTRACT

For a converging solar cell element capable of preventing excessive concentration of converged sunlight to one point without lowering the degree of light convergence, a p+ layer 14 and an n+ layer 12 are formed on the rear surface of a silicon substrate; a positive pole 16 and a negative pole 18 are formed in response to the respective layers; and, on the front surface side, a light receiving surface 24 is formed with a bank portion 28 which enhances intensity in the surrounding area. In the central portion of the light receiving surface 24, a projected portion 26 is formed, which scatters converged sunlight and prevents the concentration of converged sunlight to one point.

4 Claims, 4 Drawing Sheets

CONVERGING SOLAR CELL ELEMENT

BACKGROUND OF THE INVENTION

1. Field of the Invention

The present invention relates to a converging solar battery element, and more particularly to a converging solar cell element having an improved light receiving surface in which electrodes are formed on the rear surface of a silicon substrate.

2. Description of the Related Art

Solar cells are used for a number of applications and there have been proposed many different types of converging solar cell modules in which sunlight is converged by means of a lens system so that the total area of expensive solar cells can be reduced in order to reduce the cost of electric power generating systems using these solar cells. In addition, various sun tracking systems have been proposed to enhance the power generating efficiency of the converging solar cell module.

In such converging solar cell modules, converging solar cell elements each having solar cells and their electrodes for outputting electric currents are used. When a spot formed by converged sunlight irradiates the light receiving surface of the converging solar cell, free electrons and electron holes as carriers are generated inside a silicon substrate. The generated carriers are separated by a p-n junction, and the free electrons are output through an n-layer and the holes through a p-layer as currents from respective electrodes. In the conventional converging solar cell element stated above, the sun is tracked in a two-dimensional or three-dimensional direction while sunlight is converged with a converging lens. A converged spot (higher than 10 W/cm$^2$), sometimes intensified more than 100 times, directly irradiates the light receiving portion of the solar cell. It is desirable to increase the degree of light convergence as much as possible in order to lower costs and improve the power generating efficiency in a converging solar cell module. However, if the degree of light convergence becomes too high, the size of the converged spot decreases, and the area generating the carriers and increasing a current density is reduced. As a result, internal resistance increases when the carriers move, voltage drops occur, the problem of decreased output power is created.

Also, if such a converged spot with a high degree of light convergence is generated on the light receiving surface, the surface temperature will experience sudden local rises, and cooling provided by cooling water may sometimes be insufficient. Especially, if a converged spot with an intensity greater than 18 W/cm$^2$ is received, the temperature at the light receiving portion may rise to more than 100° C., which leads to certain problems, for example, solder adhesion may decrease and the converging solar cell element may be damaged. Also, if the converging solar cell element is directly cooled with cooling water, adhesion between a mounting substrate and a sealing agent for water-proofing electrodes may be degraded, resulting in cooling water invading to the electrode side of the converging solar cell element, thereby creating a danger of electrodes corrosion or broken wires.

SUMMARY OF THE INVENTION

The present invention is conceived to overcome the conventional problems stated above and its object is to provide a converging solar cell element capable of preventing excessive concentration of converged sunlight at one point, without lowering the degree of light convergence.

To achieve the object stated above, the present invention provides a converging solar cell element including a silicon substrate which has a front surface or a light receiving surface and a rear surface on which electrodes are provided, wherein the light receiving surface is provided with one or two or more projected portions.

In said converging solar cell element, the projected portion has a pyramid shape or a truncated pyramid shape and the element has a feature that the length of one side of the bottom of the projected portion is from $\frac{1}{100}$ to $\frac{1}{10}$ of the diameter of a converging lens.

Another feature of said converging solar cell element is that, if one projected portion is used, it is located at the center of a light receiving surface. Alternatively, if two or more projected portions are used, they are located at the same intervals with the central projected portion located at the center of the light receiving surface. In all cases, the total bottom area of the projected portions is from $\frac{1}{5}$ to $\frac{1}{20}$ of the area of the light receiving surface.

DESCRIPTION OF THE PREFERRED EMBODIMENTS

The preferred embodiments of the present invention will next be described with reference to the accompanying drawings.

Figure 1A:
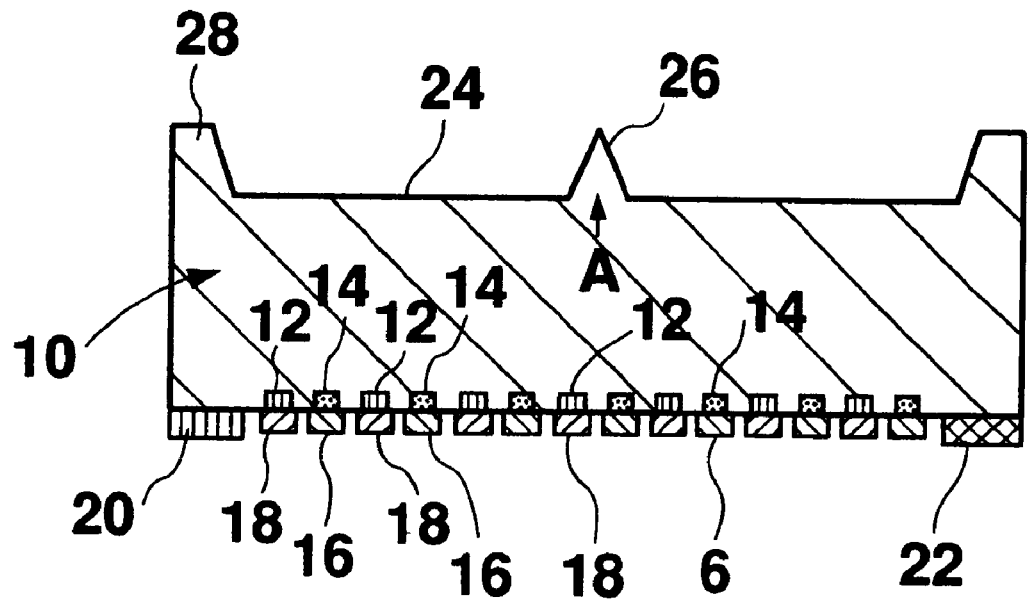
FIG. 1A is an explanatory view showing an embodiment of the converging solar cell element according to the present invention.

In FIG. 1A, there is shown a sectional view of one preferred embodiment of the converging solar cell element according to the present invention. In FIG. 1A, a silicon substrate 10 comprises a monocrystal silicon (Si) wafer having a relatively high resistance, approximately 20 to 100 Ωcm. For the silicon substrate 10, either p-type or n-type may be used. However, if the concentration of impurities is almost equal, the p-type substrate which has a slightly longer carrier life time is generally used.

Figure 2:
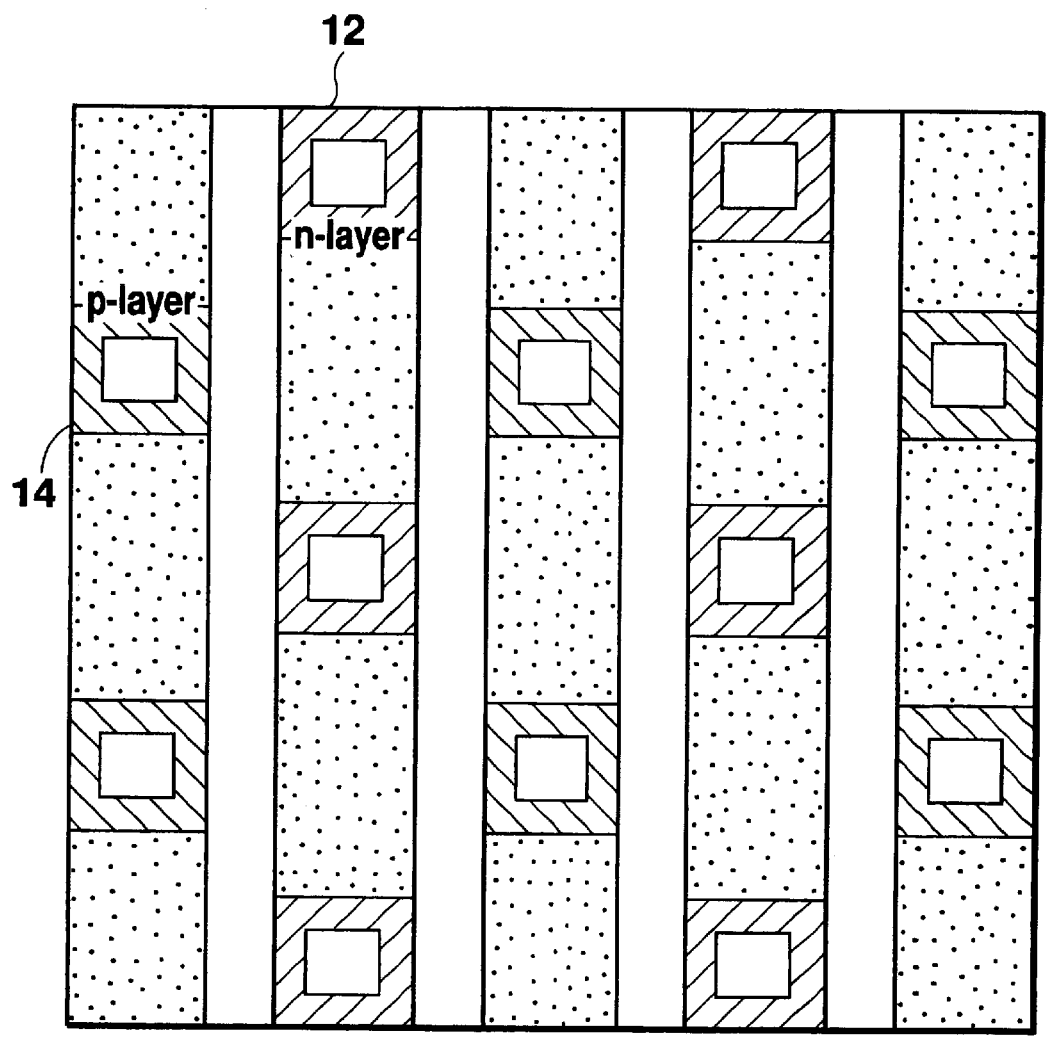
FIG. 2 is a view showing an example of arrangement of n+ layer and p+ layer of an embodiment shown in FIG. 1.

On the rear surface side of the silicon substrate 10, n+ layers 12 by phosphorus diffusion to a point or dot shape and p+ layers 14 by boron diffusion are respectively formed as illustrated in FIG. 2. Concentration of these surface impurities is $10^{19}$ to $10^{20}$ cm$^{-3}$, and thermal diffusion is so performed as to have a depth of diffusion of 1 to 3 μm. The size of each of these dotted n+ layers 12 and p+ layers 14 measures about several ten μm to several hundred μm on each side. Also, the n+ layers 12 and p+ layers 14 may be arranged in a staggered form as shown in FIG. 2 or may be arranged linearly along a row of electrodes formed in a comb shape.

Returning to FIG. 1A, on the surface on the rear side of the silicon substrate 10 an aluminum (Al) layer is formed by a vapor deposition method or a printing method. This aluminum layer is separated into positive poles 16 connected to the p+ layers 14 and negative layers 18 connected to the n+ layers 14 by a photolithography method performing etching treatment after patterning. Moreover, bus electrodes 20 and 22 are also formed at that time. A light receiving surface 24 is formed by a photolithography method on the front surface side of the silicon substrate 10, that is, the surface opposite to the surface where the positive poles 16 and the negative poles 18 are formed. In this case, one or more pyramid-like projected portions 26 are formed at one place or several places on the light receiving surface 24. Also, a bank portion 28 is formed around the light receiving surface 24 in order to increase the strength of the converging solar cell element and prevent ruptures.

If only one projected portion 26 is to be formed on the light receiving surface 24, this projected portion 26 is located in a central portion A of the light receiving surface 24. If a plurality of such projected portions 26 are to be provided on the light receiving surface 24, they are arranged at equal intervals in a direction surrounding the light receiving surface 24 around the central portion A of the light receiving surface 24.

Figure 1B:
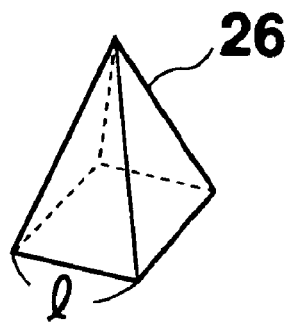
FIG. 1B is a perspective view of an example of a projected portion formed on a light receiving surface of the converging solar cell element shown in FIG. 1.
Figure 1C:
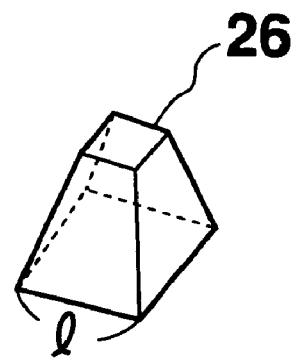
FIG. 1C is a perspective view showing another example of the projected portion formed on the light receiving surface of the converging solar cell element shown in FIG. 1.

Pyramid, that is, a quadrangular pyramid shape shown in FIG. 1B, or truncated pyramid, in which the upper portion of a quadrangular pyramid is cut off as shown in FIG. 1C, are desirable shapes for the projected portions 26. However, other shapes, such as cones, can be also used as long as they have a projected construction.

Within a configuration as stated above, if a spot of solar light converged by a converging lens (not illustrated on the light receiving surface 24) irradiates the light receiving surface 24, carriers are generated in the silicon substrate with free electrons among the carriers are generated in the silicon substrate. Free electrons are collected to the n+ layers while the holes are collected to the p+ layers 14 and withdrawn as currents from the positive poles 16 and negative poles 18. Also in this case, even though a converged spot having a high degree of light convergence irradiates one point in the light receiving surface 24, the converged spot is scattered in that vicinity by the respective projected portion 26, and thus local sunlight concentrations are prevented. Because of this, power droppage due to high current density in a small area or damage to a converging solar cell element due to a temperature rise can be avoided.

In order to prevent the concentration of converged light onto one point, a higher effect can be obtained by increasing the size of each projected portion 26 and also increasing the number of the projected portions 26. However, if each projected portion 26 is enlarged and the shape of each projected portion 26 is a pyramid or truncated pyramid, then the length of its base, that is, the length l of the side where the light receiving surface intersects with the projected portion 26 also increases. Also, if the number of the projected portions 26 increases, then the total area of the bases of all the projected portions also increases. As mentioned above, if the length l of a side of the projected portion 26 is increased or the total of the bottom area is increased, the carriers created by the sunlight incident to the light receiving surface 24 are mixed with the carrier created the sunlight incident to the light receiving surface 24 other than the projected portions 26, causing the output power of the converging solar cell element to decrease and thereby creating a problem.

Carriers created in the projected portions 26 will have much longer arriving distance to the n+ layers 12 and P+ layers 14 compared to carriers created at other than the projected portions 26. Because of this, in the positive poles 16 and the negative poles 18, the potential of the carriers created in the projected portions 26 becomes lower by a voltage drop (IR) due to a longer moving distance than the potential of the carriers created at other than the projected portions 26. These carriers are related parallel connections with each other. Therefore, if each projected portion 26 is enlarged and its number increases, then the carriers, which are created in the projected portions 26 and have a low potential, are also increased in number. This lowers the output voltage of the converging solar cell element.

By the reason as stated above, the length l of one side of a projected portions 26 and the total value of the bottom area of all the projected portions 26 have optimum ranges as stated below. That is, when the shape of each projected portion 26 is a pyramid or truncated pyramid, the length l of its base depends on the area of a converging lens to be used but a desirable value is about 1/100 to 1/10 of the diameter of the converging lens. Moreover, the total area of the bases of all the projected portions 26 should be about 1/5 to 1/20 of the area of the light receiving surface 24.

When these values become smaller than the ranges stated above, the dispersion ability of the converged spot decreases and a local temperature rise or the like on the light receiving surface 24 is triggered. On the other hand, where the values are greater than the ranges stated above, the power generating ability of the converging solar cell element decreases.

In an example, a light receiving surface 24 was irradiated by a converged spot (20 W/cm$^2$) created by concentrating sunlight 200 times with a converging lens, and a projected portion 26 having a length l for 1 side, which was 1/30 of the diameter of a converging lens, was provided on the light receiving surface 24. The temperature rise of the converging solar cell element was then measured. In this case, the converged spot was designed so as to hit the projected portion 26.

For the light receiving surface 24, the temperature rise was measured while cooling with still water, but the temperature at the light receiving surface 24 did not exceed 27° C. above the water temperature, and temperatures high enough to damage the converging solar cell element did not occur. On the other hand, where the projected portion 26 was not formed, the temperature at the light receiving surface 24 rose to 58° C. above the water temperature. When, for example, the water temperature rose to above 42° C., the temperature at the light receiving surface 24 exceeded 100° C. and the possibility of damaging the converging solar cell element becomes real.

Therefore, it can be understood that forming the projected portion 26 effectively prevents the concentration of the converged spot into 1 point on the light receiving surface 24.

Also, photoelectric conversion efficiency was measured for a case with a projected portion 26 and a case without such a projected portion. The photoelectric conversion efficiency was 17.2 to 17.5% when the projected portion 26 with the size as stated above was formed, but was 17.4 to 17.6% without the projected portion 26. From these results, even though a projected portion was formed, the power generating ability of the converging solar cell element was found to be little affected by the projected portion.

Figure 3A:
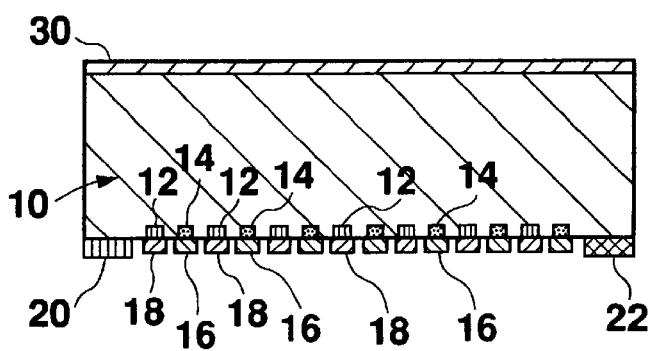
FIGS. 3A, 3B, 3C and 3D are explanatory views of a process of forming the projected portion of the embodiment shown in FIG. 1.
Figure 3B:
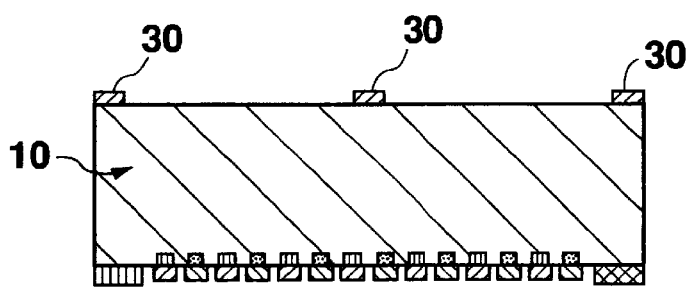

FIGS. 3A–3D show how the projected portion 26 may be formed. In FIG. 3, resist 30 is applied to the front surface side of the silicon substrate 10, on the rear surface of which positive poles 16 and negative poles 18 are formed. Then, as shown in FIG. 3B, patterning is performed in such a manner that the resists 30 remain in the central portion and area surrounding the silicon substrate 10. The edges of the resist 30 to be remained in the central portion should be in the range of about 100 μm to 1,000 μm on each side. The drawing shows a configuration of leaving the resist 30 only at one place in the central part of the silicon substrate 10, but the number of resists 30 should be determined in relation to the number of the projected portions 26.

Figure 3C:
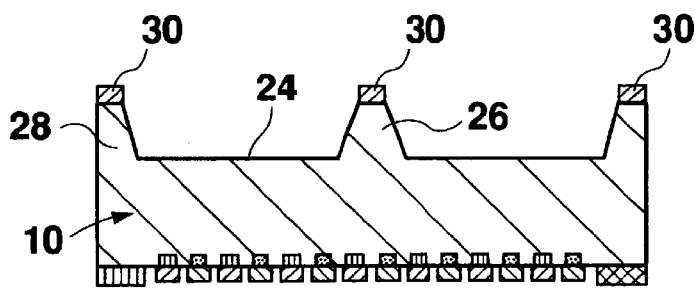

Now, as shown in FIG. 3C, etching of the silicon substrate 10 is performed using an alkaline solution such as KOH, NaOH, or the like, and a bank portion 28 is formed in the surroundings of the silicon substrate 10, with the projected portion 26 formed in the central part.

Figure 3D:
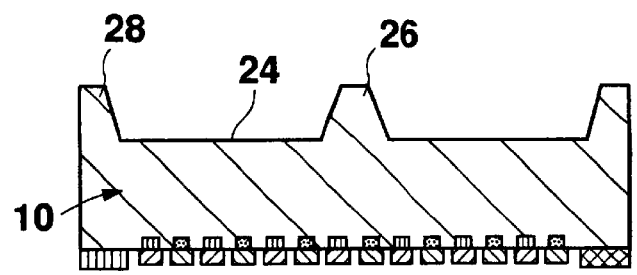

Finally, as shown in FIG. 3D, the resist 30 is removed and a converging solar cell element is created with the projected portion 26 formed at the center. In the example shown in FIGS. 3A–3D, the projected portion 26 has a truncated pyramid shape. However, as described previously, the shape of the projected portion 26 is not limited to such a shape.

Figure 4:
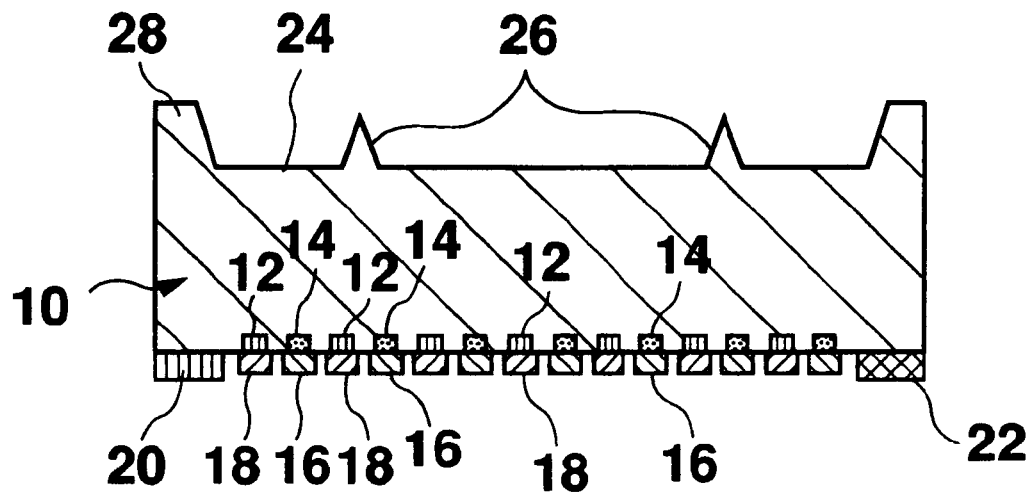
FIG. 4 is a sectional view of another embodiment of the converging solar cell element according to the present invention.
Figure 5:
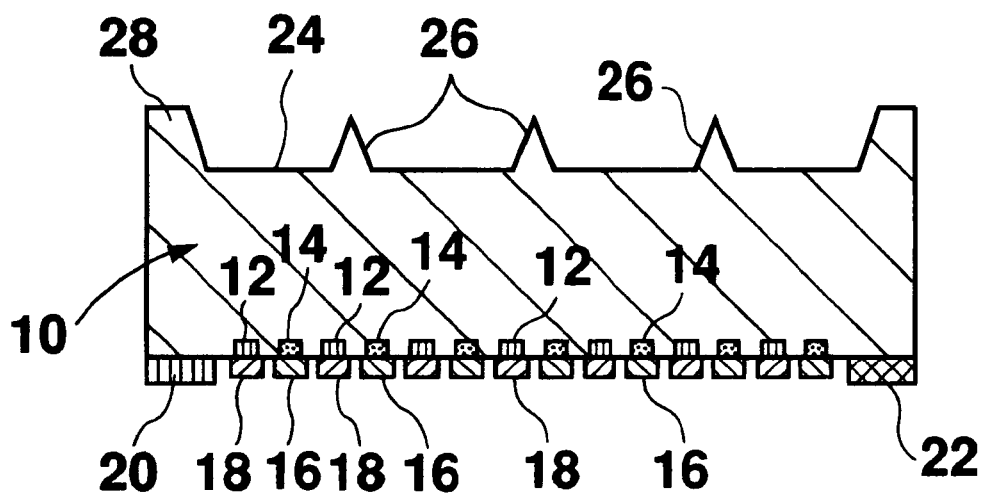
FIG. 5 is a sectional view of still another embodiment of the converging solar cell element according to the present invention.

FIGS. 4 and 5 illustrate sectional views of other preferred embodiments of the converging solar cell elements according to the present invention. In FIG. 4, the number of projected portions 26 is set to 2. Other elements are configured the same as in FIG. 1. Also in FIG. 5, the number of the projected portions 26 is 3, while other elements are configured as in FIG. 1. As shown in FIGS. 4 and 5, the number of the projected portions 26 can be increased, by which concentration of the converged spot onto one point can be prevented. However, as stated before, if the number of the projected portions 26 increases and the total bottom area becomes excessive, then the power generating ability of the converging solar cell elements decreases, and thus said number should be set at a value which does not cause such a decrease in the power generating ability. As explained above, the projected portions of the present invention are able to scatter converged light when sunlight is tracked by moving the converging solar cell elements in a two-dimensional or three-dimensional direction, so that the concentration of the converged light onto one point on the light receiving surface can be prevented. Local rises in temperature of the light receiving surface can thereby be prevented and breakage of the converging solar cell element can be avoided. In addition, decreases in the output power due to a voltage drops resulting from rises in current density can also be prevented. Consequently, the present invention is able to provide a converging solar cell element having a high endurance and a high photoelectric conversion efficiency.

What is claimed is:

1. A converging solar cell element comprising a silicon substrate having a front surface or a light receiving surface and a rear surface on which electrodes are formed, wherein said front surface or light receiving surface is provided with one projected portion, and wherein the projected portion is provided at the center of said front surface or light receiving surface and has a bottom area between $1/5$ to $1/20$ of the area of said front surface or light receiving surface.

2. A converging solar cell element according to claim 1 and for receiving light from a convergent lens having a lens diameter, wherein the projected portion is of a pyramid or truncated pyramid shape, the bottom side of the projected portion having a length of from $1/100$ to $1/10$ of the lens diameter.

3. A converging solar cell element comprising a silicon substrate having a front surface or a light receiving surface and a rear surface on which electrodes are formed, wherein said front surface or light receiving surface is provided with two or more projected portions, and wherein said two or more projected portions are arranged at a regular interval about a central portion of said front surface or light receiving surface and have a total bottom area between $1/5$ to $1/20$ of the area of said front surface or light receiving surface.

4. A converging solar cell element according to claim 3 and for receiving light from a convergent lens having a lens diameter, wherein each of said projected portions is of a pyramid or truncated pyramid shape, the bottom side of each projected portion having a length of from $1/100$ to $1/10$ of the lens diameter.

* * * * *